United States Patent
Miura

(10) Patent No.: US 7,714,226 B2
(45) Date of Patent: May 11, 2010

(54) HOUSING DEVICE AND ELECTRONIC APPARATUS

(75) Inventor: Shinsuke Miura, Kawasaki (JP)

(73) Assignee: NEC Infrontia Corporation, Kanagawa (JP)

( * ) Notice: Subject to any disclaimer, the term of this patent is extended or adjusted under 35 U.S.C. 154(b) by 434 days.

(21) Appl. No.: 11/752,835

(22) Filed: May 23, 2007

(65) Prior Publication Data

US 2007/0281535 A1 Dec. 6, 2007

(30) Foreign Application Priority Data

May 31, 2006 (JP) .............................. 2006-151831

(51) Int. Cl.
*H02G 3/08* (2006.01)

(52) U.S. Cl. ..................... 174/50; 174/520; 174/17 R; 361/679.01

(58) Field of Classification Search ................... 174/50, 174/17 R, 520, 53, 57, 58; 220/3.2–3.9, 220/4.02; 361/600, 601, 679.07, 679.02, 361/679.06, 724, 726, 725; 439/347, 535
See application file for complete search history.

(56) References Cited

U.S. PATENT DOCUMENTS

| 6,000,767 | A * | 12/1999 | Liu et al. ..................... 361/725 |
| 6,636,425 | B2 * | 10/2003 | Shim .......................... 361/726 |
| 6,909,047 | B2 * | 6/2005 | Zhang .......................... 174/50 |
| 6,912,349 | B2 * | 6/2005 | Clark et al. ................... 174/50 |
| 6,999,320 | B2 * | 2/2006 | Fan ......................... 361/679.02 |
| 2006/0012272 | A1 | 1/2006 | Miyamoto | |

FOREIGN PATENT DOCUMENTS

| EP | 0 798 834 A1 | 3/1997 |
| JP | 58-77085 U | 5/1983 |
| JP | 10-313181 A | 11/1998 |

\* cited by examiner

*Primary Examiner*—Angel R Estrada
(74) *Attorney, Agent, or Firm*—Sughrue Mion, PLLC

(57) ABSTRACT

In a housing device, a first wall portion 10A and a second wall portion 20A are adjacent to each other with a right angle formed therebetween when a case cover 20 is coupled to a case main body 10. A first recess 11 and a first claw 12 are integrally formed with the first wall portion 10A at a part thereof where the first wall portion 10A is butted to the second wall portion 20A. A second claw 21 and a second recess 22 are integrally formed with the second wall portion 20A at a part thereof where the second wall portion 20A is butted to the first wall portion 10A.

8 Claims, 7 Drawing Sheets

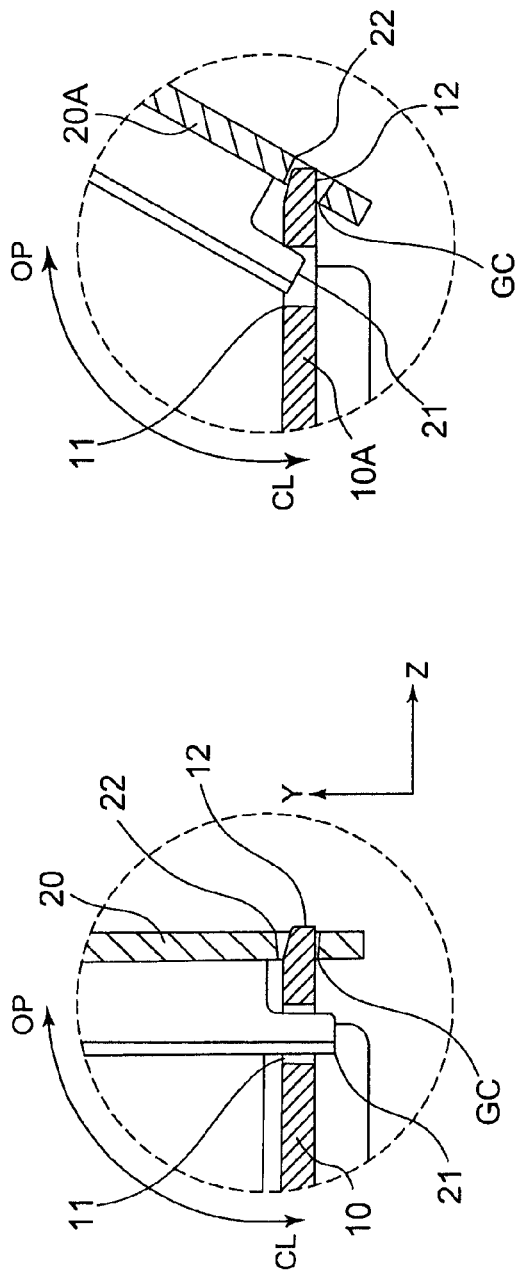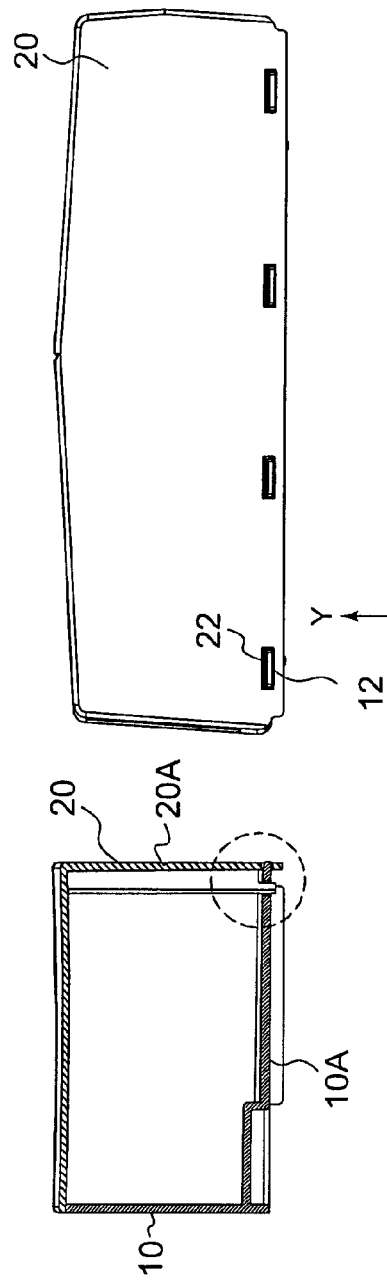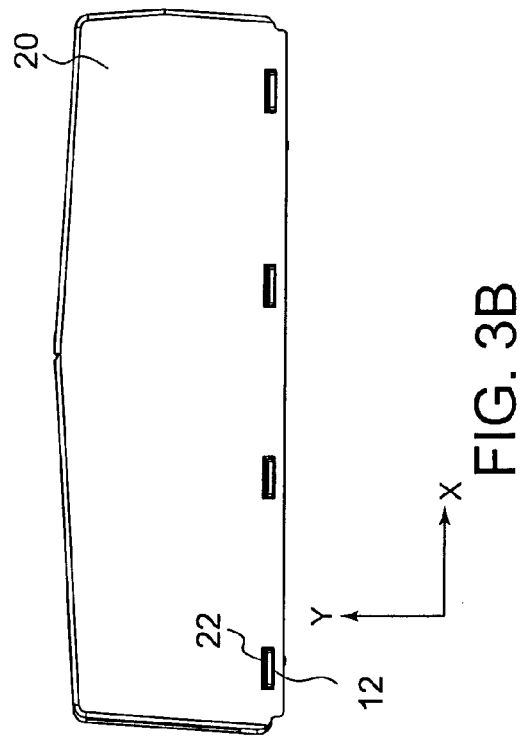

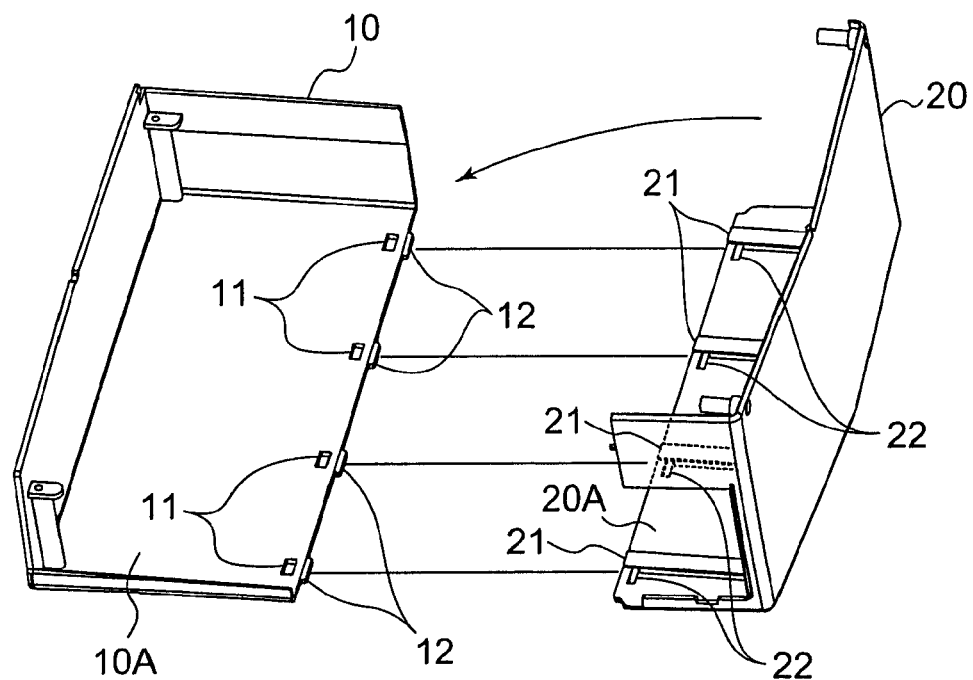
FIG. 4A
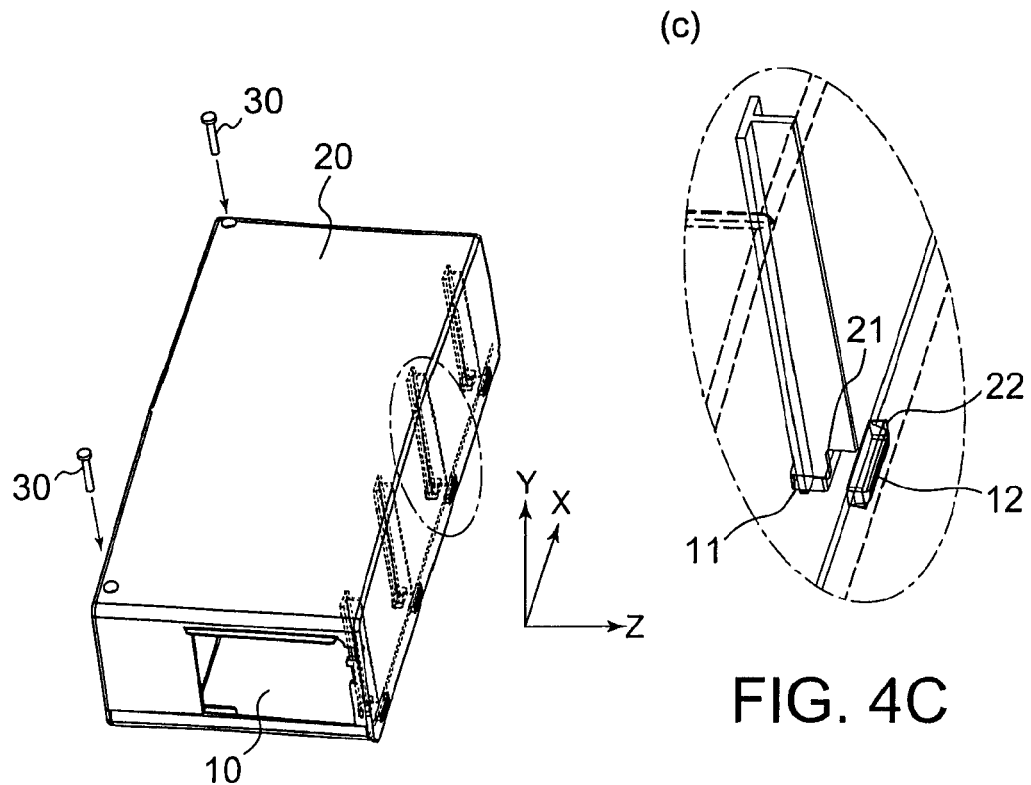
FIG. 4B
FIG. 4C

HOUSING DEVICE AND ELECTRONIC APPARATUS

This application claims priority to prior Japanese patent application JP 2006-151831, the disclosure of which is incorporated herein by reference.

BACKGROUND OF THE INVENTION

This invention relates to a housing device for various kinds of apparatuses including an electronic apparatus and, in particular, to a housing device comprising a case main body and a case cover removably coupled to the case main body.

Generally, a housing device of the type is designed so that a case main body is opened and closed by the use of a case cover in order to incorporate various electronic parts and mechanisms in a production process and to perform repair and maintenance. For an opening/closing structure of the case cover with respect to the case main body, it is desired that the case cover is not easily released in three-axis directions and that the structure is low in production cost and excellent in operability.

Referring to FIG. 1, a first conventional housing device will be described. The housing device comprises a case main body 110 and a case cover 120 removably coupled to the case main body 110. The case cover 120 is coupled to the case main body 110 via a hinge structure comprising an axial pin 130 and a pin stopper 140 so that the case cover 120 is rotatable in a direction OP and a direction CL to be opened and closed. The case cover 120 is removed from the case main body 110 by removing the pin stopper 140 and the axial pin 130.

Referring to FIGS. 2A to 2C, a second conventional housing device will be described. The housing device comprises a case main body 210 and a case cover 220 removably coupled to the case main body 210. The case main body 210 has a first recess 211 and a first claw 212. The case cover 220 has a second claw 221 adapted to be inserted into the first recess 211 and a second recess (hole) 222 adapted to receive the first claw 212. The case cover 220 is coupled to the case main body 210 to be openable and closable. By engagement between the first recess 211 and the second claw 221 and engagement between the first claw 212 and the second recess (hole) 222, the case cover 220 is coupled to the case main body 210. In order to prevent the case cover 220 from being easily released in a direction Z, the case cover 220 is provided with a rib 230.

Another housing device is disclosed in Japanese Unexamined Patent Application Publication (JP-A) No. H10-313181. The housing device comprises a case main body and a case cover removably coupled to the case main body. The case main body has a hole. The case cover is provided with a hook adapted to be inserted into the hole. The case cover is coupled to the case main body so that the case cover is rotatable around a pivot point to be opened and closed with respect to the case main body. The case cover is coupled to the case main body by engagement between the hole and the hook. The case cover is removed from the case main body by rotating the case cover around the pivot point and opening the case cover with respect to the case main body.

SUMMARY OF THE INVENTION

In the first conventional housing device, the hinge structure has a complicated shape and the number of parts is large. Therefore, the production cost is high and the operability is inferior when the case cover is opened and closed.

The second conventional housing device has the rib in order to prevent the case cover from being easily released in the direction Z. Therefore, the shape is complicated and the production cost is high.

The housing device disclosed in Japanese Unexamined Patent Application Publication (JP-A) No. H10-313181 has the hook. Therefore, the number of parts is large and the production cost is high.

It is therefore an object of this invention to provide a housing device which is capable of preventing a case cover from being easily released in three-axis directions and which is low in production cost and excellent in operability.

Housing devices according to this invention and an electronic apparatus are as follows:

(1) A housing device comprising a case main body comprising a first wall portion and a case cover comprising a second wall portion and adapted to be removably coupled to the case main body, the first wall portion having a first recess and a first claw, the second wall portion having a second claw adapted to be inserted into the first recess and a second recess adapted to receive the first claw, wherein:

the first and the second wall portions are adjacent to each other with a right angle formed therebetween when the case cover is coupled to the case main body;

the first recess and the first claw being integrally formed with the first wall portion at a part thereof where the first wall portion is butted to the second wall portion;

the second claw and the second recess being integrally formed with the second wall portion at a part thereof where the second wall portion is butted to the first wall portion.

(2) The housing device according to the above-mentioned (1), wherein the case cover is rotatably and removably coupled to the case main body via a hinge mechanism, the hinge mechanism comprising the first claw and the second recess.

(3) The housing device according to the above-mentioned (1), wherein:

the first recess is formed at a position near an end portion of the first wall portion to be perpendicular to a first inner wall surface of the first wall portion;

the first claw extending from the end portion of the first wall portion in parallel to the first inner wall surface;

the second claw extending from an end portion of a rib standing on a second inner wall surface of the second wall portion to be in parallel to the second inner wall surface;

the second recess being formed at a position near an end portion of the second wall portion to be perpendicular to the second inner wall surface.

(4) The housing device according to the above-mentioned (3), wherein the case cover is rotatably and removably coupled to the case main body via a hinge mechanism, the hinge mechanism comprising the first claw and the second recess.

(5) The housing device according to the above-mentioned (1), wherein the case cover is rotatably and removably coupled to the case main body via a hinge mechanism, the hinge mechanism comprising the first recess and the second claw.

(6) The housing device according to the above-mentioned (1), wherein:

the first claw extends from an end portion of a rib standing on a first inner wall surface of the first wall portion to be in parallel to the first inner wall surface;

the first recess being formed at a position near an end portion of the first wall portion to be perpendicular to the first inner wall surface;

the second recess being formed at a position near an end portion of the second wall portion to be perpendicular to a second inner wall surface of the second wall portion;

the second claw extending from the end portion of the second wall portion in parallel to the second inner wall surface.

(7) The housing device according to the above-mentioned (6), wherein the case cover is rotatably and removably coupled to the case main body via a hinge mechanism, the hinge mechanism comprising the first recess and the second claw.

(8) The housing device according to the above-mentioned (1), further comprising a screw fastening structure for releasably fixing the case cover to the case main body.

(9) An electronic apparatus comprising the housing device according to the above-mentioned (1) and an electric part mounted in the housing device for performing an electric operation.

In the housing device according to this invention, the case cover is not easily released in the three-axis directions. In addition, the housing device is low in production cost because an opening/closing structure requires no additional part or parts and has a simple shape.

BRIEF DESCRIPTION OF THE DRAWING

FIGS. 3A to 3D show a housing device according to an embodiment of this invention, FIG. 3A being a sectional view, FIG. 3B being a side view, FIGS. 3C and 3D being partial enlarged views;

FIGS. 4A to 4C are views for describing opening and closing operations of the housing device illustrated in FIGS. 3A to 3D, FIGS. 4A and 4B are perspective views, FIG. 4C being a partial enlarged view;

DESCRIPTION OF THE PREFERRED EMBODIMENTS

Figure 1:
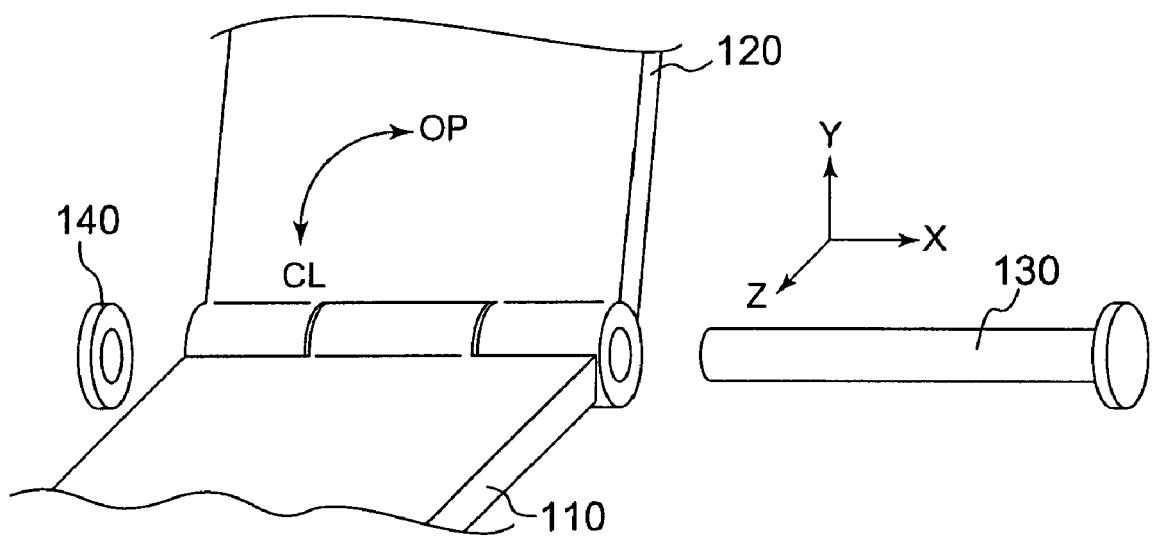
FIG. 1 is a perspective view showing a first conventional housing device.
Figure 2A:
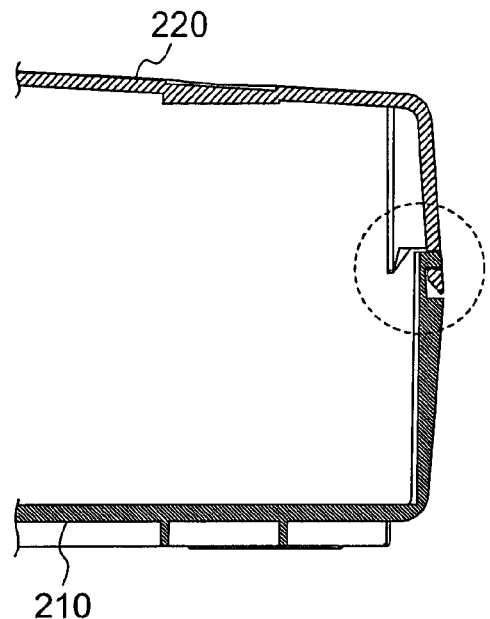
FIGS. 2A to 2C show a second conventional housing device, FIG. 2A being a sectional view, FIG. 2B being a side view, FIGS. 2C being partial enlarged view.
Figure 2B:
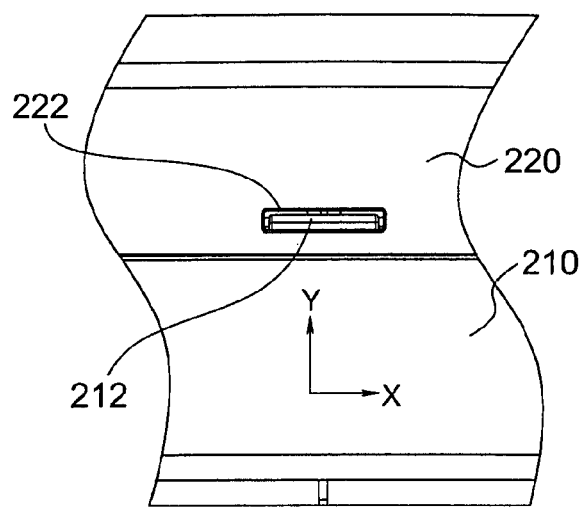
Figure 2C:
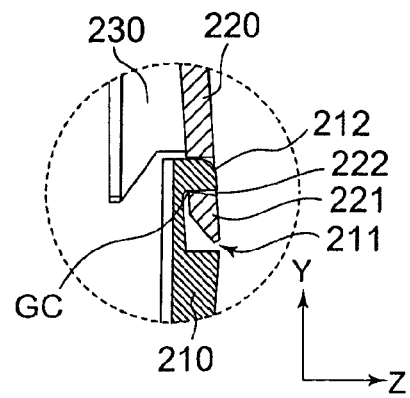
Figure 5A:
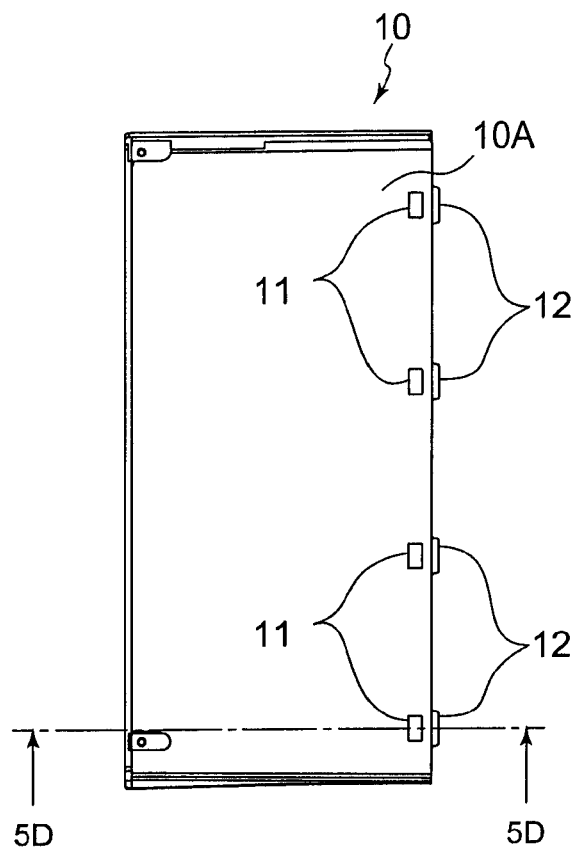
FIGS. 5A to 5D are views showing a case main body of the housing device illustrated in FIGS. 3A to 3D, FIG. 5A being a plan view, FIGS. 5B and 5C being side views, FIG. 5D being a sectional view taken along a line 5D-5D in FIG. 5A.
Figure 5B:
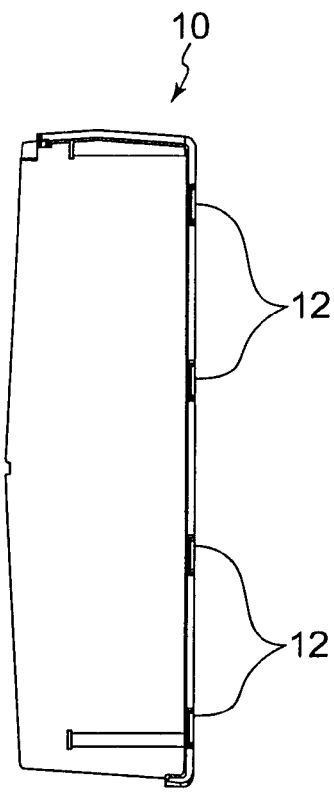
Figure 5C:
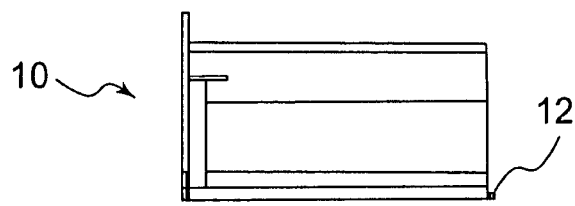
Figure 5D:
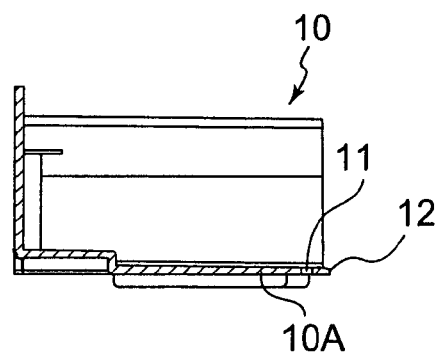
Figure 6A:
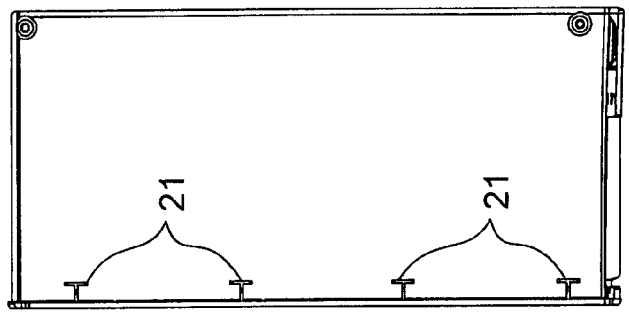
FIGS. 6A to 6E are views showing a case cover of the housing device illustrated in FIGS. 3A to 3D, FIGS. 6A, 6C, and 6E being side views, FIG. 6B being a plan view, FIG. 6D being a bottom view.
Figure 6B:
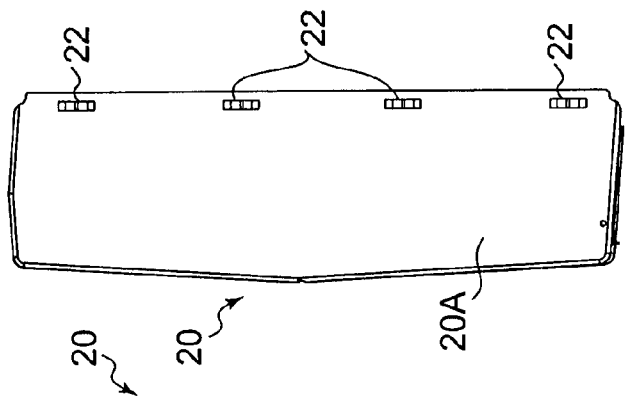
Figure 6C:
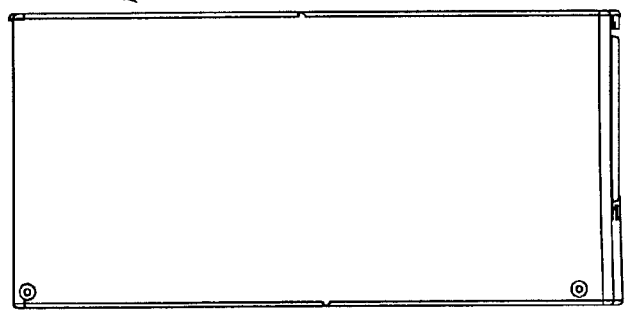
Figure 6D:
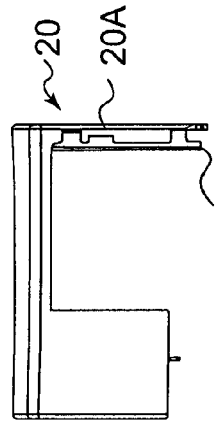
Figure 6E:
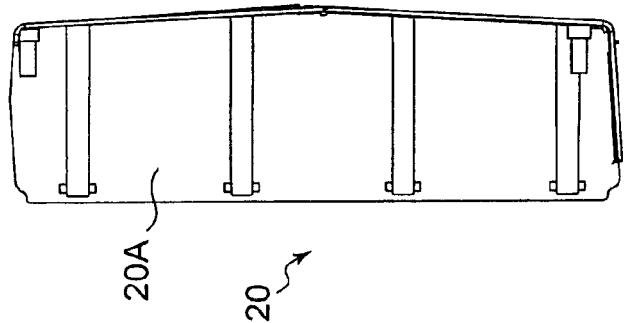

Now, housing devices according to embodiments of this invention will be described in detail with reference to the drawing.

Referring to FIGS. 3A to 3D, 4A to 4C, 5A to 5D, and 6A to 6E, a housing device according to an embodiment of this invention comprises a case main body 10 including a first wall portion 10A and a case cover 20 including a second wall portion 20A and adapted to be removably coupled to the case main body 10. Each of the case main body 10 and the case cover 20 is made of a resin material and formed by injection molding.

The first wall portion 10A has a plurality of first recesses (holes) 11 and a plurality of first claws 12. The second wall portion 20A has a plurality of second claws 21 adapted to be inserted into the first recesses 11, respectively, and a plurality of second recesses (holes) 22 adapted to receive the first claws 12, respectively.

In the housing device, the first and the second wall portions 10A and 20A are adjacent to each other with a right angle formed therebetween when the case cover 20 is coupled to the case main body 10.

The first recesses 11 and the first claws 12 are integrally formed with the first wall portion 10A at a part thereof where the first wall portion 10A is butted to the second wall portion 20A. The second claws 21 and the second recesses 22 are integrally formed with the second wall portion 20A at a part thereof where the second wall portion 20A is butted to the first wall portion 10A.

More specifically, the first recesses 11 are formed at positions near to an end portion of the first wall portion 10A to be perpendicular to a first inner wall surface of the first wall portion 10A. The first claws 12 extend from the end portion of the first wall portion 10A in parallel to the first inner wall surface. The second claws 21 extend from end portions of a plurality of ribs standing on a second inner wall surface of the second wall portion 20A to be in parallel to the second inner wall surface of the second wall portion 20A. The second recesses 22 are formed at positions near an end portion of the second wall portion 20A to be perpendicular to the second inner wall surface.

The case cover 20 is rotatably and removably coupled to the case main body 10 via a hinge mechanism. The hinge mechanism comprises the first claws 12 and the second recesses 22. The hinge mechanism has a pivot point GC illustrated in FIGS. 3C and 3D.

Referring to FIG. 4B, dimensional axes (three-axis directions X, Y, and Z) of the housing device are defined as shown in the figure. Engagement between the first recesses 11 and the second claws 21 inhibits movement of the case cover 20 with respect to the case main body 10 in the directions X and Z. Engagement between the second recesses 22 and the first claws 12 inhibits movement of the case cover 20 with respect to the case main body 10 in the directions X and Y. As a consequence, the case cover 20 is not easily released from the case main body 10 in each of the three-axis directions X, Y, and Z.

Furthermore, the case cover 20 is securely fixed to the case main body 10 by the use of screws 30.

Next, description will be made of opening and closing operations of the housing device.

The case main body 10 illustrated in FIGS. 5A to 5D and the case cover 20 illustrated in FIGS. 6A to 6E are prepared as shown in FIG. 4A. Although not shown in the figures, electric parts such as electronic circuits are mounted in the case main body 10.

As illustrated in FIG. 3D, the second claws 21 are inserted into the first recesses 11. Simultaneously, the first claws 12 are inserted into the second recesses 22. Further, the case cover 20 is rotated around the pivot point GC in a direction CL to be closed with respect to the case main body 10.

As illustrated in FIG. 3C, the second claws 21 are already inserted into the first recesses 11. In addition, the first claws 12 are already inserted into the second recesses 22. Further, as illustrated in FIG. 4B, the case cover 20 is fixed to the case main body 10 by the use of the screws 30.

Upon maintenance of the electric parts in the case main body 10 of the housing device illustrated in FIG. 4B, the screws 30 are removed. Further, as shown in FIG. 3D, the case cover 20 is rotated around the pivot point GC in a direction OP to be opened with respect to the case main body 10. Further, as illustrated in FIG. 4A, the case cover 20 is removed from the case main body 10.

Figure 7:
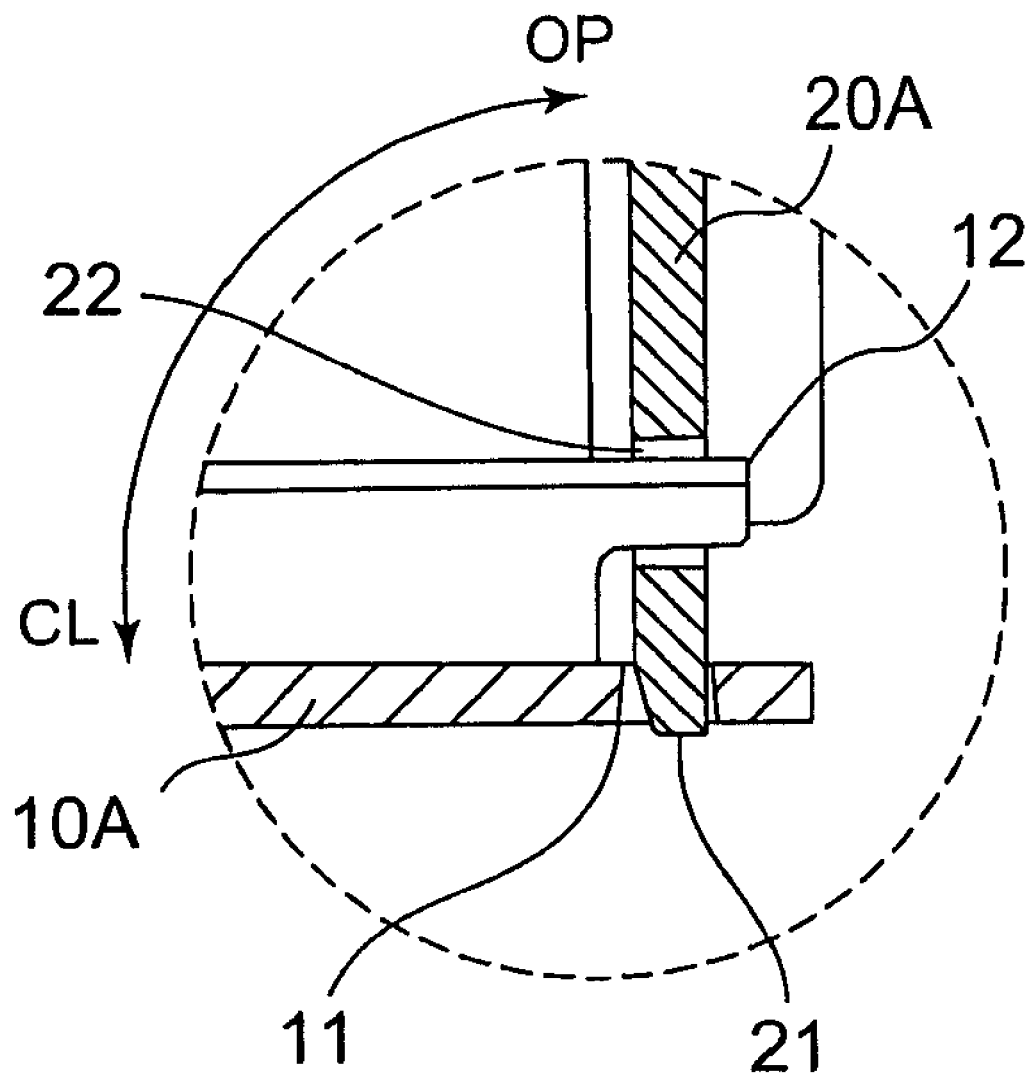
FIG. 7 is a partial enlarged view which is similar to FIG. 3C and which shows a housing device according to another embodiment of this invention.

Referring to FIG. 7 in addition to FIGS. 3A and 3B, a housing device according to another embodiment of this invention will now be described.

In the manner shown in FIGS. 3A and 3B, the housing device according to the other embodiment of this invention also comprises a case main body 10 including a first wall portion 10A and a case cover 20 including a second wall portion 20A and adapted to be removably coupled to the case main body 10. Each of the case main body 10 and the case cover 20 is made of a resin material and formed by injection molding.

The first wall portion 10A has a plurality of first recesses (holes) 11 and a plurality of first claws 12. The second wall portion 20A has a plurality of second claws 21 adapted to be inserted into the first recesses 11, respectively, and a plurality of second recesses (holes) 22 adapted to receive the first claws 12, respectively.

In the housing device, the first and the second wall portions 10A and 20A are adjacent to each other with a right angle formed therebetween when the case cover 20 is coupled to the case main body 10.

The first recesses 11 and the first claws 12 are integrally formed with the first wall portion 10A at a part thereof where the first wall portion 10A is butted to the second wall portion 20A. The second claws 21 and the second recesses 22 are integrally formed with the second wall portion 20A at a part thereof where the second wall portion 20A is butted to the first wall portion 10A.

In FIG. 7, the first claw 12 extends from an end portion of a rib standing on a first inner wall surface of the first wall portion 10A to be in parallel to the first inner wall surface. The first recess 11 is formed at a position near an end portion of the first wall portion 10A to be perpendicular to the first inner wall surface. The second recess 22 is formed at a position near an end portion of the second wall portion 20A to be perpendicular to a second inner wall surface of the second wall portion 20A. The second claw 21 extends from the end portion of the second wall portion 20A in parallel to the second inner wall surface. In this case, the case cover 20 (FIG. 3A) is rotatably and removably coupled to the case main body 10 (FIG. 3A) via a hinge mechanism which includes the first recess 11 and the second claw 21.

Although this invention has been described in conjunction with the preferred embodiment thereof, this invention is not limited to the foregoing embodiment but may be modified in various manners within the scope of the appended claims.

For example, the housing device is applicable to various kinds of electronic apparatuses such as an information processing apparatus, a communication apparatus, and an electric household appliance. The electric parts mounted in the case main body 10 are not only the electronic parts requiring maintenance but may be batteries requiring exchange.

What is claimed is:

1. A housing device comprising a case main body comprising a first wall portion and a case cover comprising a second wall portion and adapted to be removably coupled to the case main body, the first wall portion having a first recess and a first claw, the second wall portion having a second claw adapted to be inserted into the first recess and a second recess adapted to receive the first claw, wherein:
   the first and the second wall portions are adjacent to each other with a right angle formed therebetween when the case cover is coupled to the case main body;
   the first recess and the first claw being integrally formed with the first wall portion at a part thereof where the first wall portion is butted to the second wall portion;
   the second claw and the second recess being integrally formed with the second wall portion at a part thereof where the second wall portion is butted to the first wall portion; and
   wherein:
   the first recess is formed at a position near an end portion of the first wall portion to be perpendicular to a first inner wall surface of the first wall portion;
   the first claw extending from the end portion of the first wall portion in parallel to the first inner wall surface;
   the second claw extending from an end portion of a rib standing on a second inner wall surface of the second wall portion to be in parallel to the second inner wall surface;
   the second recess being formed at a position near an end portion of the second wall portion to be perpendicular to the second inner wall surface.

2. The housing device according to claim 1, wherein the case cover is rotatably and removably coupled to the case main body via a hinge mechanism, the hinge mechanism comprising the first claw and the second recess.

3. The housing device according to claim 1, further comprising a screw fastening structure for releasably fixing the case cover to the case main body.

4. An electronic apparatus comprising the housing device according to claim 1 and an electric part mounted in the housing device for performing an electric operation.

5. A housing device comprising a case main body comprising a first wall portion and a case cover comprising a second wall portion and adapted to be removably coupled to the case main body, the first wall portion having a first recess and a first claw, the second wall portion having a second claw adapted to be inserted into the first recess and a second recess adapted to receive the first claw, wherein:
   the first and the second wall portions are adjacent to each other with a right angle formed therebetween when the case cover is coupled to the case main body;
   the first recess and the first claw being integrally formed with the first wall portion at a part thereof where the first wall portion is butted to the second wall portion;
   the second claw and the second recess being integrally formed with the second wall portion at a part thereof where the second wall portion is butted to the first wall portion; and
   wherein:
   the first claw extends from an end portion of a rib standing on a first inner wall surface of the first wall portion to be in parallel to the first inner wall surface;
   the first recess being formed at a position near an end portion of the first wall portion to be perpendicular to the first inner wall surface;
   the second recess being formed at a position near an end portion of the second wall portion to be perpendicular to a second inner wall surface of the second wall portion;
   the second claw extending from the end portion of the second wall portion in parallel to the second inner wall surface.

6. The housing device according to claim 5, wherein the case cover is rotatably and removably coupled to the case main body via a hinge mechanism, the hinge mechanism comprising the first recess and the second claw.

7. The housing device according to claim 5, further comprising a screw fastening structure for releasably fixing the case cover to the case main body.

8. An electronic apparatus comprising the housing device according to claim 5 and an electric part mounted in the housing device for performing an electric operation.

* * * * *